US008383253B2

(12) United States Patent
Hinoue et al.

(10) Patent No.: US 8,383,253 B2
(45) Date of Patent: *Feb. 26, 2013

(54) MAGNETIC RECORDING MEDIUM UTILIZING A RECORDING LAYER HAVING MORE AND LESS CONCENTRATED PARTS OF A NONMAGNETIC ELEMENT IN AN IN-PLANE DIRECTION AND MANUFACTURING METHOD THEREOF

(75) Inventors: Tatsuya Hinoue, Kanagawa (JP); Hiroshi Kanai, Kanagawa-ken (JP); Toshinori Ono, Tokyo (JP); Hiroyuki Suzuki, Kanagawa (JP); Hiroshi Inaba, Kanagawa (JP)

(73) Assignee: HGST Netherlands B.V., Amsterdam (NL)

( * ) Notice: Subject to any disclaimer, the term of this patent is extended or adjusted under 35 U.S.C. 154(b) by 326 days.

This patent is subject to a terminal disclaimer.

(21) Appl. No.: 12/378,777

(22) Filed: Feb. 18, 2009

(65) Prior Publication Data

US 2009/0214895 A1    Aug. 27, 2009

(30) Foreign Application Priority Data

Feb. 22, 2008    (JP) ................................ 2008-041875

(51) Int. Cl.
*G11B 5/65* (2006.01)
(52) U.S. Cl. ..................... 428/827; 428/829; 428/836.1
(58) Field of Classification Search .......................... None
See application file for complete search history.

(56) References Cited

U.S. PATENT DOCUMENTS

| 6,055,139 | A | 4/2000 | Ohtsuka et al. |
| 6,665,145 | B2 | 12/2003 | Wada |
| 7,311,983 | B2* | 12/2007 | Watanabe et al. ............. 428/829 |
| 7,405,011 | B2 | 7/2008 | Stipe et al. |
| 7,471,484 | B2 | 12/2008 | Wachenschwanz et al. |
| 7,608,193 | B2 | 10/2009 | Wachenschwanz et al. |
| 7,615,292 | B2 | 11/2009 | Ito et al. |
| 7,670,696 | B2 | 3/2010 | Fullerton et al. |
| 2005/0214583 | A1 | 9/2005 | Ito et al. |

(Continued)

FOREIGN PATENT DOCUMENTS

| JP | 05-205257 | 8/1993 |
| JP | 8096340 A | 4/1996 |

(Continued)

OTHER PUBLICATIONS

Derwent Abstract of US 2009/0202865 A1 (Derwent Acc-No. 2009-G63934) (pub. Apr. 2, 2009).*

(Continued)

*Primary Examiner* — Kevin Bernatz

(57) ABSTRACT

Embodiments of the present invention produce discrete track media and bit patterned media having both excellent read/write performance and reliability. According to one embodiment, the medium comprises a magnetic layers formed by at least two ferromagnetic alloy layers with different compositions on a substrate. The ferromagnetic alloy layer located closest to the medium surface has more concentrated parts and less concentrated parts of nonmagnetic element in the in-plane direction. The more concentrated parts of the nonmagnetic element contain more nonmagnetic elements than the other parts except for an intermediate layer in the magnetic recording layer. The more concentrated parts and the less concentrated parts of the nonmagnetic element in the ferromagnetic alloy layer located closest to the medium surface are formed substantially concentric. The more concentrated parts of the nonmagnetic element is formed by being doped with ions of nonmagnetic element.

15 Claims, 17 Drawing Sheets

U.S. PATENT DOCUMENTS

| | | | | |
|---|---|---|---|---|
| 2006/0222898 A1* | 10/2006 | Ichihara | | 428/826 |
| 2007/0042226 A1* | 2/2007 | Marinero et al. | | 428/831 |
| 2007/0218318 A1 | 9/2007 | Watanabe | | |
| 2007/0224455 A1* | 9/2007 | Iida et al. | | 428/831.2 |
| 2008/0075845 A1* | 3/2008 | Sonobe et al. | | 427/130 |
| 2008/0292907 A1* | 11/2008 | Berger et al. | | 428/828 |
| 2009/0123660 A1* | 5/2009 | Inaba et al. | | 427/535 |
| 2009/0202865 A1* | 8/2009 | Kimura et al. | | 428/828 |
| 2009/0213497 A1* | 8/2009 | Ono et al. | | 360/135 |
| 2009/0214898 A1* | 8/2009 | Hinoue et al. | | 428/848.5 |
| 2010/0084374 A1* | 4/2010 | Kimura et al. | | 216/22 |

FOREIGN PATENT DOCUMENTS

| | | |
|---|---|---|
| JP | 9167336 | 6/1997 |
| JP | 3034879 | 4/2000 |
| JP | 2000268340 A | 9/2000 |
| JP | 2002288813 A | 10/2002 |
| JP | 2004005915 A | 1/2004 |
| JP | 20006019000 A | 1/2006 |
| JP | 2006309841 | 11/2006 |
| JP | 2007220164 | 8/2007 |
| JP | 2007226862 | 9/2007 |
| WO | 2009041286 | 4/2009 |

OTHER PUBLICATIONS

Machine Translation of JP 2006-309841 A (Patent published Nov. 2006).*

Machine Translation of JP 05-205257 A (patent published 1993).*

* cited by examiner

MAGNETIC RECORDING MEDIUM UTILIZING A RECORDING LAYER HAVING MORE AND LESS CONCENTRATED PARTS OF A NONMAGNETIC ELEMENT IN AN IN-PLANE DIRECTION AND MANUFACTURING METHOD THEREOF

CROSS-REFERENCE TO RELATED APPLICATION

The instant nonprovisional patent application claims priority to Japanese Patent Application No. 2008-041875 filed Feb. 22, 2008 and which is incorporated by reference in its entirety herein for all purposes.

BACKGROUND OF THE INVENTION

In recent years, magnetic recording and reproducing devices have been requested to attain more capacity and achieve higher performance due to increasing amount of information for personal computers and expanding applications to image recording apparatus, car navigation apparatus, and the like. For higher recording density, a smaller unit of magnetization reversal in magnetic recording media and media noise reduction are required. Conventional magnetic recording media have adopted a configuration that the ferromagnetic crystal grains comprising magnetic recording layers are preliminarily separated by nonmagnetic materials contained in magnetic recording layers.

To increase the magnetic recording density by active control of the separators, discrete track media in which recording tracks are separated, and further, bit patterned media in which recording bits are separated, have been researched and developed. The technique to form the separators has been a significant point for higher recording density in both of these media. For example, following techniques have been proposed to form the separators in discrete track media. One technique is the substrate processing type which preliminarily forms concentric lands and grooves on a substrate and forms a magnetic film thereon to form a patterned magnetic film. Another technique is the magnetic layer processing type which masks a magnetic film and etches the parts of a magnetic film to be grooves to form the pattern.

These techniques, however, include a plurality of processes such as backfilling nonmagnetic materials into the grooves, planarizing the surface so as to have the same level as the magnetic film to be the islands, and forming a protection film on the planarized surface. Consequently, other problems arise such as increase in foreign substances produced on the surfaces of the magnetic film and the protection film and increase in roughness of the surfaces. They prevent the reduction in the spacing between a magnetic head and a magnetic disk (nano-spacing), which is another point for higher recording density.

To overcome these problems, a method of forming separators by ion implantation has been attempted. For example, Japanese Patent Publication No. H5-205257 ("Patent Document 1") discloses a method of forming separators between recording tracks of a discrete track medium by altering the magnetic property by means of nitrogen ion implantation into a magnetic layer, for example. According to Patent Document 1, this method can increase the track density without being significantly affected by the process accuracy to decrease the track width for a head. Japanese Patent Publication No. H9-167336 ("Patent Document 2") attempted a method of forming servo patterns by ion implantation. According to Patent Document 2, the flatness of the surface can be much more improved.

Methods for separating recording tracks in discrete track media or recording bits in bit patterned media are important issues. In use of the methods in the above-listed documents, to improve the track density while preventing side writings onto recording tracks, forming separators across the magnetic layer in the film thickness direction is required. The forming separators require ion implantation of a nonmagnetic element across the magnetic layer in the film thickness direction at a sufficiently high acceleration voltage. In the meanwhile, if the acceleration voltage is raised, the thickness of a mask layer formed on the magnetic layer should be increased to prevent the recording tracks on the magnetic layer from being doped with nonmagnetic element ions. In this regard, if the thickness of the mask layer is increased, a problem arises that pattern collapse occur when the pattern pitch of the mask layer is narrowed for higher recording density. Therefore, the film thickness of the mask layer should be thinned so as to match the pattern pitch. However, if the film thickness is thinned and the acceleration voltage is high, the mask layer may not be able to sufficiently block the radiated ions and the recording tracks of the magnetic layer are doped with the nonmagnetic element ions. As a result, the magnetic property of the recording tracks is changed so that the read/write performance is disadvantageously deteriorated. In this case, it is necessary to lower the acceleration voltage in the ion implantation to reduce the implantation energy. However, if the implantation energy is reduced, separators may not be formed across the magnetic layer in the film thickness direction. If the structure of the magnetic layer is not appropriate, a magnetic flux induced by the magnetic layer remained undoped under the separators strays to the surface of separators to cause noise. Then, when the implantation energy is reduced, it is necessary to optimize the structure of the magnetic layer so as to match the implantation energy.

BRIEF SUMMARY OF THE INVENTION

Embodiments of the present invention produce discrete track media and bit patterned media having both excellent read/write performance and reliability. According to the embodiment of FIG. 6, the medium comprises magnetic layers formed by at least two ferromagnetic alloy layers 18 and 19 with different compositions on a substrate. The ferromagnetic alloy layer 19 located closest to the medium surface has more concentrated parts 23 and less concentrated parts of nonmagnetic element in the in-plane direction. The more concentrated parts of the nonmagnetic element contain more nonmagnetic elements than the other parts except for an intermediate layer in the magnetic recording layer. The more concentrated parts and the less concentrated parts of the nonmagnetic element in the ferromagnetic alloy layer located closest to the medium surface are formed substantially concentric. The more concentrated parts of the nonmagnetic element is formed by being doped with ions of nonmagnetic element 22.

DETAILED DESCRIPTION OF THE INVENTION

Figure 1:
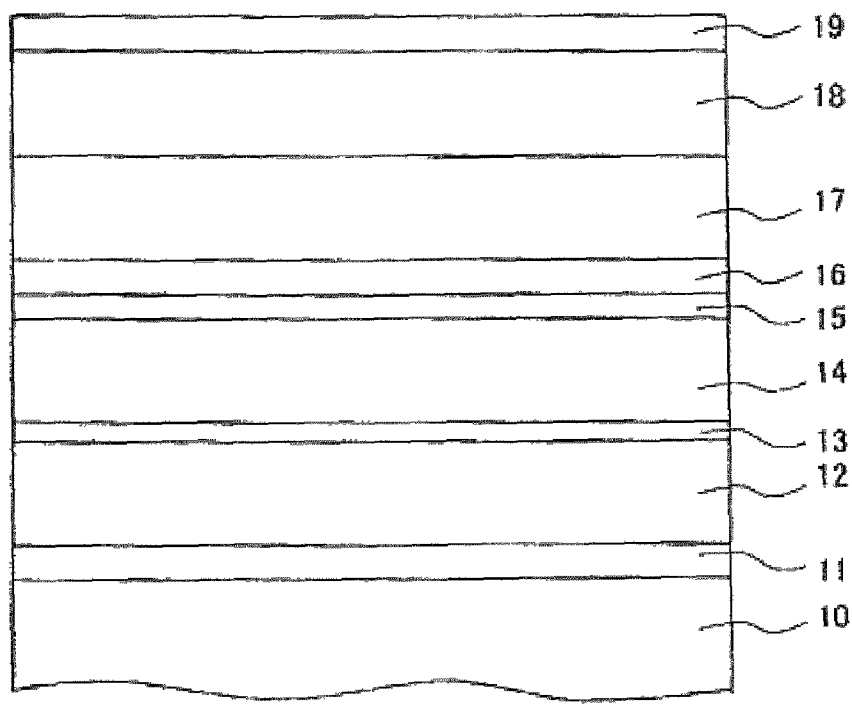
FIG. 1 is a drawing illustrating a manufacturing step of a magnetic recording medium according to Example 1.

Embodiments of the present invention relate to patterned media suitable for high recording density represented by discrete track media and bit patterned media, and a manufacturing method thereof, and more particularly, relate to track guide separators.

Embodiments of the present invention provide discrete track media or bit patterned media with good read/write performance and high reliability. In particular, in forming separators of the discrete track media or bit patterned media by ion implantation, it is aimed to produce magnetic recording media achievable of higher recording density by controlling the implantation energy so as not to damage the recording tracks or recording bits and optimizing the structure of the magnetic layer so as to match the implantation energy.

The magnetic recording medium according to embodiments of the present invention comprises a magnetic recording layer formed directly or indirectly on a substrate, and the magnetic recording layer has a structure in which at least two ferromagnetic alloy layers having different compositions are stacked directly or with an intermediate layer interposed therebetween. The magnetic recording medium further comprises more concentrated parts and less concentrated parts of nonmagnetic element arranged in the in-plane direction of the layer which is located closest to the medium surface among the at least two ferromagnetic alloy layers. The more concentrated parts of the nonmagnetic element in the ferromagnetic alloy layer located closest to the medium surface have higher concentration of the nonmagnetic element than the part except for the intermediate layer in the magnetic recording layer.

The more concentrated parts and the less concentrated parts of the nonmagnetic element in the ferromagnetic alloy layer located closest to the medium surface are formed substantially concentrically. The less concentrated parts of the nonmagnetic element in the ferromagnetic alloy layer located closest to the medium surface may have higher concentration of the ferromagnetic element than the other part in the magnetic recording layer.

The nonmagnetic element may be one or more kinds of elements selected from the group consisting of Cr, Mo, W, V, Nb, Ta, Ti, Zr, Hf, Ru, B, C, Si, and Ge.

The magnetic recording layer may include Co. If the magnetic recording layer contains Co, it is desirable that the nonmagnetic element is Cr or Ta. If the magnetic recording layer contains Co, it is desirable that the less concentrated parts of the nonmagnetic element in the layer which is located closest to the medium surface among the ferromagnetic alloy layers have higher concentration of Co than the other part in the magnetic recording layer.

The more concentrated parts of the nonmagnetic element may be formed by implanting ions of the nonmagnetic element.

According to embodiments of the present invention, discrete track media or bit patterned media with good recording and reproducing performance and high reliability may be produced.

Hereinafter, particular embodiments of the present invention will be described with reference to the drawings.

EXAMPLE 1

Referring to FIGS. 1 to 8, an example of a magnetic recording medium (magnetic disk) according to Example 1 of the present invention is presented.

In the manufacturing process shown in FIG. 1, a substrate made of borosilicate glass or aluminosilicate glass whose surface was chemically strengthened was used as a substrate 10 after cleaning and drying. Instead of the chemically strengthened glass substrate, an aluminum alloy substrate with Ni—P coating and surface polishing or a rigid substrate made of Si- or Ti-alloy may be used.

On the substrate processed in the above step, a 5 nm of 50 at. % Al-50 at. % Ti alloy layer as a adhesion layer 11, a 15 nm of 51 at. % Fe-34 at. % Co-10 at. % Ta-5 at. % Zr alloy layer as a first soft-magnetic layer 12, a 0.5 nm of Ru layer as an antiferromagnetic coupling layer 13, a 15 nm of 51 at. % Fe-34 at. % Co-10 at. % Ta-5 at. % Zr alloy layer as a second soft magnetic layer 14, a 2 nm of 50 at. % Cr-50 at. % Ti alloy layer as an under layer 15, a 7 nm of 94 at. % Ni-6 at. % W alloy layer as a first orientation control layer 16, a 17 nm of Ru layer as a second orientation control layer 17, a 13 nm of 57 mol % Co-20 mol % Cr-17 mol % Pt-6 mol % $SiO_2$ alloy layer as a first magnetic layer 18, a 6 nm of 62 at. % Co-13 at. % Cr-18 at. % Pt-7 at. % B alloy layer as a second magnetic layer 19 were stacked in this order.

In depositing the layers, the substrate was transferred in vacuum and a single disk type of sputtering apparatus capable of successive deposition of multiple layers in the above-described manner was used. Target alloys of the same compositions as the desired film compositions were prepared and sputtered to form the above described alloy layers. The Ar gas pressure in the deposition was 1 Pa when depositing the layers except for the second orientation control layer 17 and the first magnetic layer 18. The Ar gas pressures in the deposition of the second orientation control layer 17 were 1 Pa for the lower 9 nm of the second orientation control layer and 5 Pa for the upper 8 nm thereof. In depositing the first magnetic layer, oxygen was added to Ar. The partial pressures of Ar and oxygen were 4 Pa and 0.2 Pa, respectively.

Figure 2:
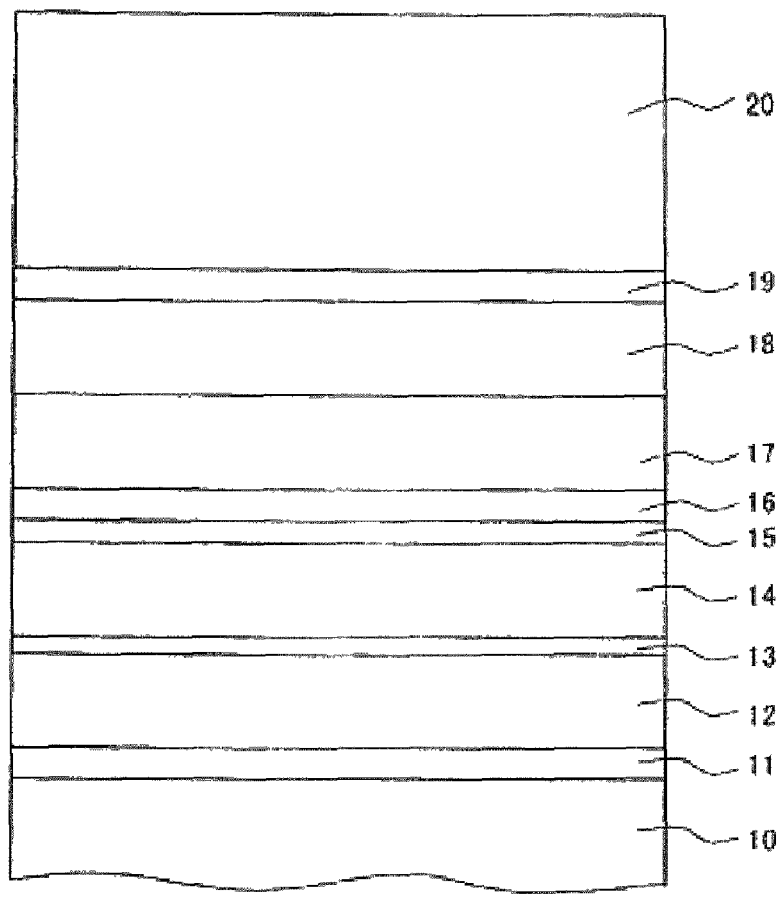
FIG. 2 is a drawing illustrating a manufacturing step of a magnetic recording medium according to Example 1.
Figure 3:
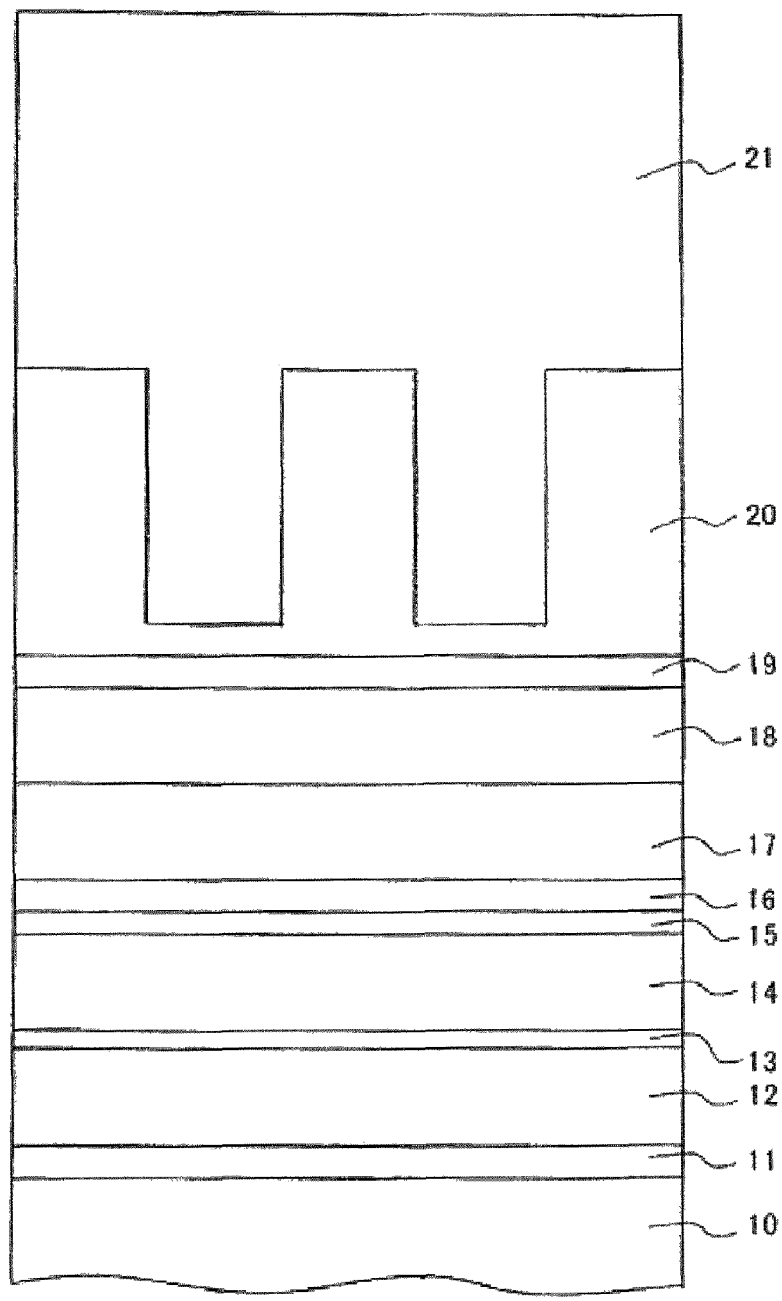
FIG. 3 is a drawing illustrating a manufacturing step of a magnetic recording medium according to Example 1.
Figure 4:
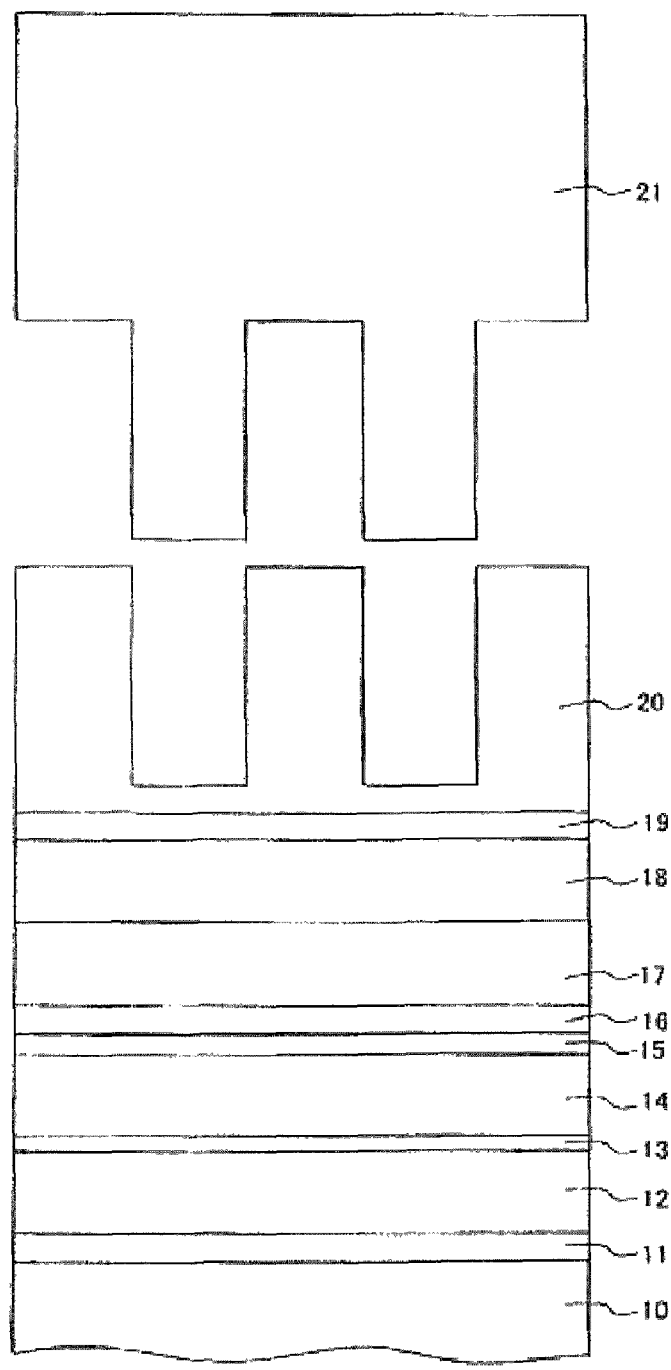
FIG. 4 is a drawing illustrating a manufacturing step of a magnetic recording medium according to Example 1.
Figure 5:
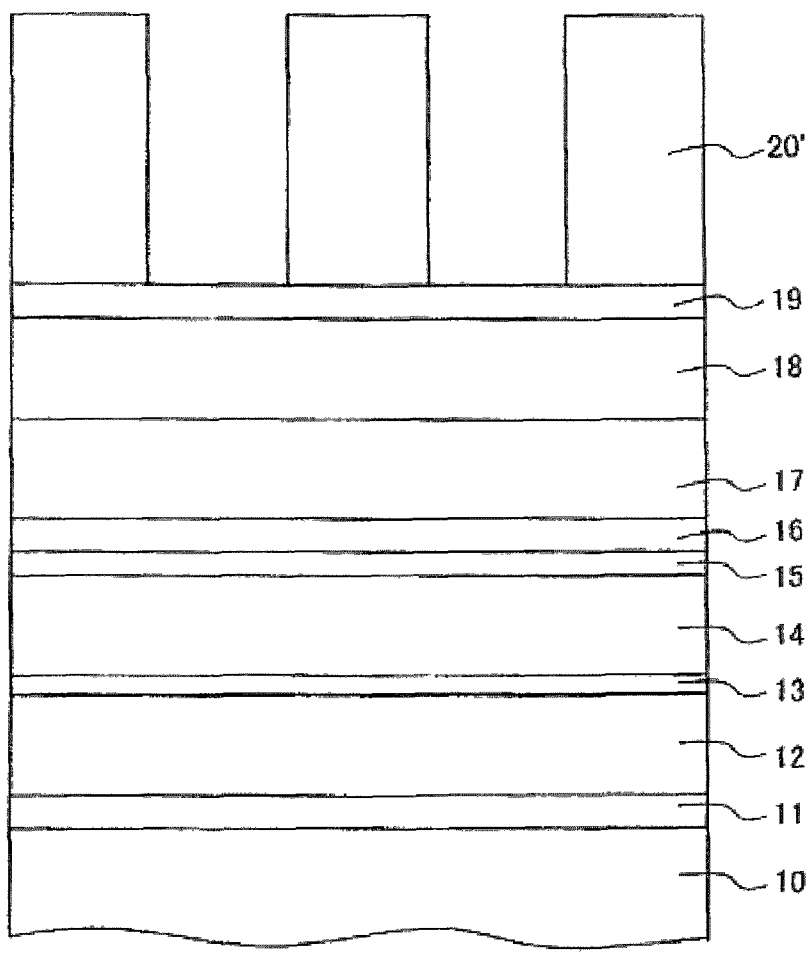
FIG. 5 is a drawing illustrating a manufacturing step of a magnetic recording medium according to Example 1.

After a resist 20 was coated with the medium processed in the above step, a stamper 21 with patterns of the same shape as the recording tracks and the servo areas was pressed against the resist 20 so that the patterns were copied onto the resist 20 (FIGS. 2 to 4). The residual resist film on the grooves of the pattern was removed by reactive ion etching (RIE)

using oxygen to form a resist pattern 20' having the track pitch of 90 nm and the track height of 90 nm (FIG. 5). This resist pattern 20' includes patterns of servo areas simultaneously formed by stamping.

Figure 6:
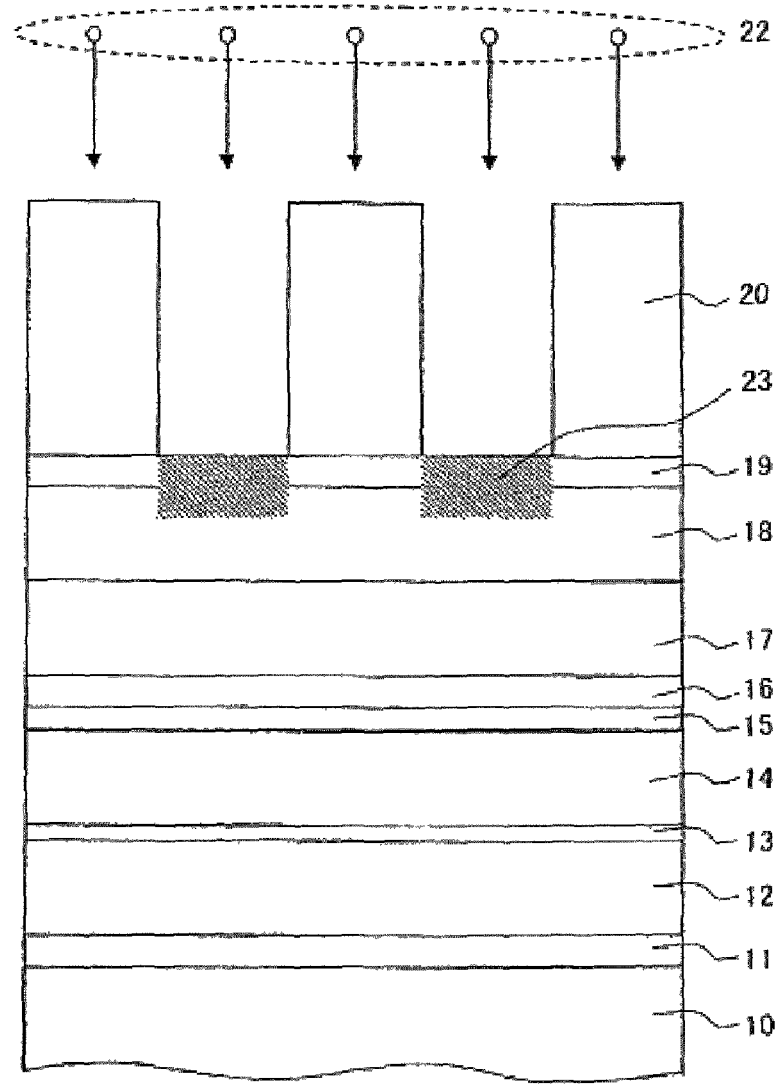
FIG. 6 is a drawing illustrating a manufacturing step of a magnetic recording medium according to Example 1.

After forming the resist pattern 20', Cr ions as nonmagnetic element ions 22 were radiated to the medium using a plasma beam to form more concentrated parts of the nonmagnetic element (Cr in the present example) as track separators 23 on some parts of the second magnetic layer 19 (FIG. 6).

To radiate ions to the medium, a method was used that generates plasma mainly composed of the nonmagnetic element (Cr in the present example) to be radiated by arc discharge at the cathode, transfers the generated plasma via a curved magnetic field duct, and radiates a plasma beam to the medium. Alternately, to radiate ions of the nonmagnetic element to the medium, an ion beam source may be used. Cr ions were radiated at the acceleration voltage of 10 kV, in the radiation amount of $1 \times 10^{15}$ to $4 \times 10^{16}/cm^2$.

Figure 7:
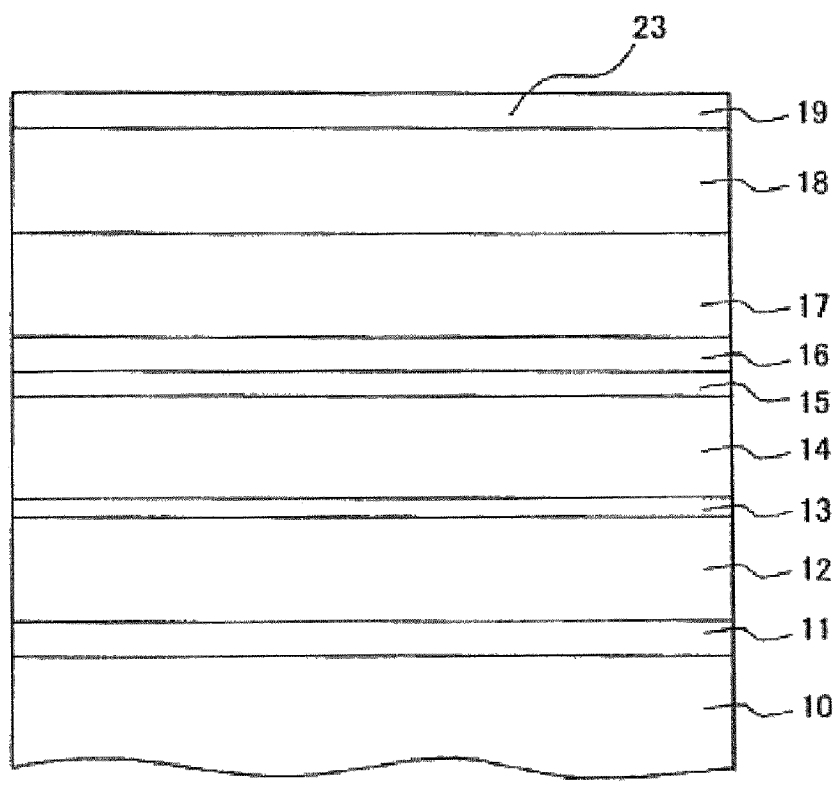
FIG. 7 is a drawing illustrating a manufacturing step of a magnetic recording medium according to Example 1.
Figure 8:
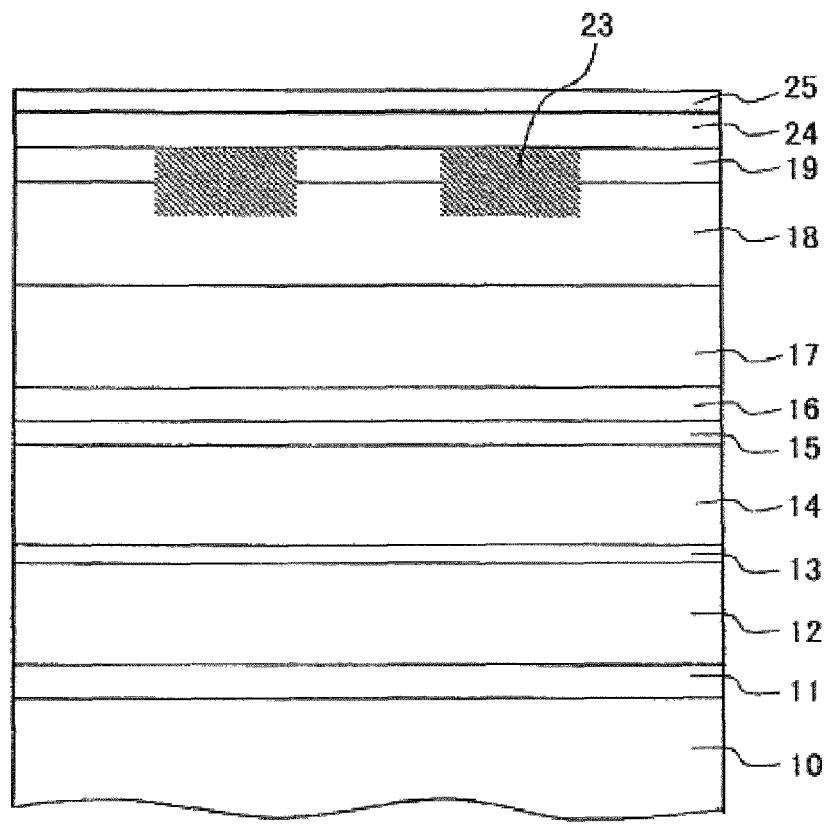
FIG. 8 is a drawing illustrating a manufacturing step of a magnetic recording medium according to Example 1.

After the Cr ion radiation, the resist pattern 20' was removed by RIE using oxygen, a 4 nm of diamond-like carbon (DLC) protection film 24 was deposited by the CVD, and a perfluoro-alkyl polyether based lubricant was coated to form a 1 nm of lubrication film 25 (FIGS. 7 and 8). Instead of the DLC protection film, a carbon protection film made by sputtering, a tetrahedral amorphous carbon (ta-C) protection film which was formed by the cathodic arc method with an ion transfer mechanism by a magnetic field filter, or the like may be used.

The magnetic write width (Mww) of the produced media was evaluated using a spin-stand. A magnetic head with a 40 nm of read track width (Twr) and a 60 nm of write track width (Tww) was used.

Figure 9:
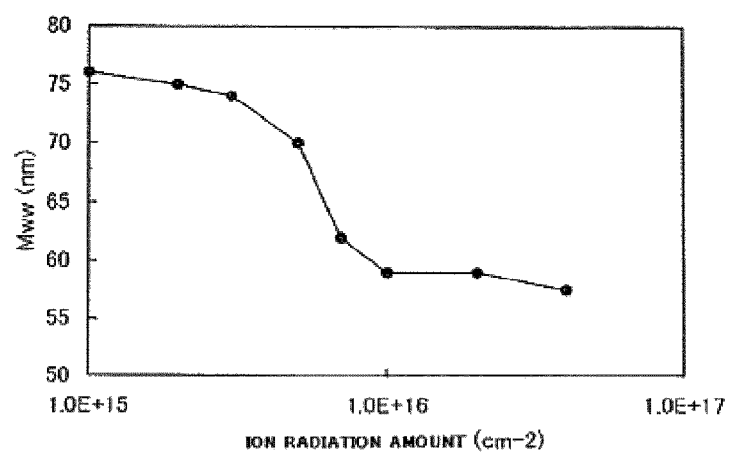
FIG. 9 is a drawing showing the evaluation results of the magnetic write width Mww.

The results are shown in FIG. 9. As the radiation amount increased, the Mww gradually decreased, and when the radiation amount became $1 \times 10^{-16}/cm^2$ or more, the Mww became almost stable at about 60 nm.

Compared with that the Mww was not less than 75 nm at the point with the least Cr radiation amount, the Mww was drastically decreased to about 60 nm in the range where the radiation amount was $1 \times 10^{16}/cm^2$ or more. Thus, it was recognized that the narrowing the track width to drastically improve track density may be achieved.

The above-described variation in Mww may be explained as follows. At the point with the least radiation amount, the increase in concentration of the nonmagnetic element (Cr) in the track separators 23 is small so that the magnetic property does not change enough to separate the tracks. The reason why the Mww decreases with increase in the radiation amount is that the concentration of the nonmagnetic element in the track separators 23 increases with the radiation amount so that the magnetization and coercivity in the track separators 23 gradually decreases, which weakens the magnetic coupling between tracks, particularly in the second magnetic layer 19. In the area of the $1 \times 10^{16}/cm^2$ or more of radiation amount where the Mww becomes almost stable, the concentration of the nonmagnetic element increases as much as the magnetization and coercivity of the track separators 23, particularly in the second magnetic layer 19, become sufficiently small. Particularly in the second magnetic layer 19, tracks are sufficiently separated.

Figure 10:
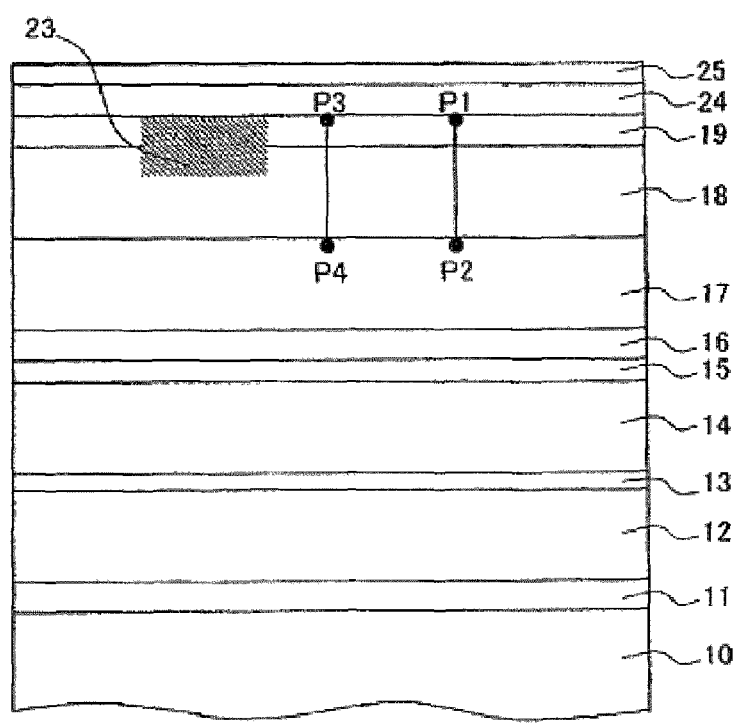
FIG. 10 is a schematic drawing showing the analysis positions in the element analysis of the medium.

With respect to samples with Cr ions radiated in the amount of $2 \times 10^{16}/cm^2$ in the present embodiment, the Cr concentrations in the track separators 23 and in the recording tracks were analyzed. An energy dispersive X-ray fluorescence spectrometer (EDX) was used in the analysis. The analysis of the track separators was conducted around the middle of the track separator in the in-plane direction, from the vicinity of the uppermost point (P1 in FIG. 10) of the second magnetic layer 19 to the vicinity of the uppermost point (P2 in FIG. 10) of the second orientation control layer 17 in the direction perpendicular to the plane. Similarly, the analysis of the recording tracks was conducted around the middle of the recording track in the in-plane direction, from the vicinity of the uppermost point (P3 in FIG. 10) of the second magnetic layer 19 to the vicinity of the uppermost point (P4 in FIG. 10) of the second orientation control layer 17 in the direction perpendicular to the plane.

Figure 11:
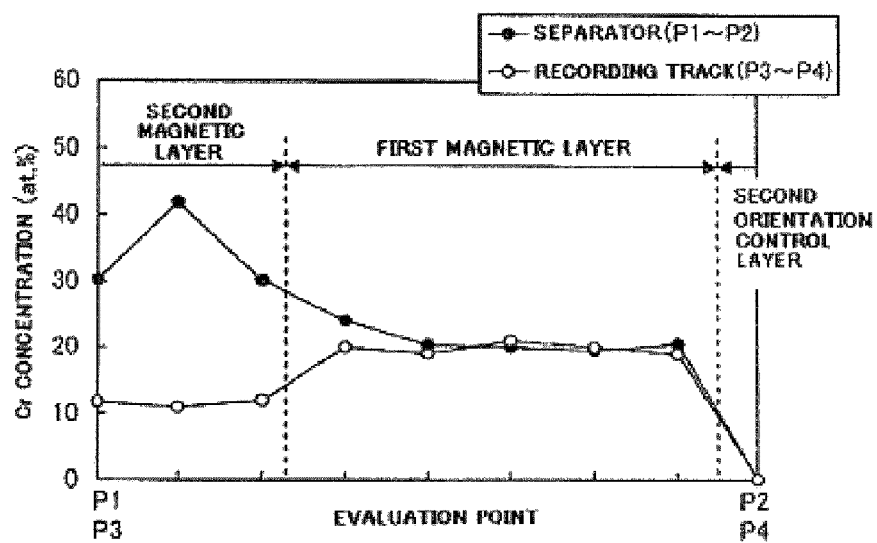
FIG. 11 is a schematic drawing showing the element analysis of the medium.

The results are shown in FIG. 11. As to the track separator 23, the Cr concentration was over 30 at. % at any position in the second magnetic layer 19. Since magnetization is almost lost in Co—Cr alloys with Cr concentration of 30 at. % or more, the magnetization in the track separator 23 was almost lost. Accordingly, it was recognized that the recording tracks, particularly in the second magnetic layer 19, were sufficiently separated.

As to the recording track, the Cr concentration in the first magnetic layer 18 was about 20 at. %, and in the second magnetic layer 19 was about 12 at. %; it was recognized that each layer had almost the same composition as the sputtered alloy.

In FIG. 11, with respect to the track separator 23, although the first magnetic layer 18 was doped with Cr in addition to the second magnetic layer 19 in the Cr radiation, the dose was small. Thus, it was recognized that the Cr concentration is highest in track separators 23 of the second magnetic layer 19.

As may be seen from the above, it was recognized that radiation of Cr ions in the amount of $1 \times 10^{16}/cm^2$ or more may sufficiently improve the track density in the present embodiment.

EXAMPLE 2

Discrete track media were prepared in the same manner as the Example 1, except that the nonmagnetic element ions 22 of the Example 1 were substituted with ions of other elements. For the nonmagnetic element ions 22, ions of any element selected from the group consisting of Mo, W, V, Nb, Ta, Ti, Zr, Hf, Ru, B, C Si, and Ge was used. The acceleration voltage and the radiation amount in ion radiation were the same as the Example 1.

Figure 12:
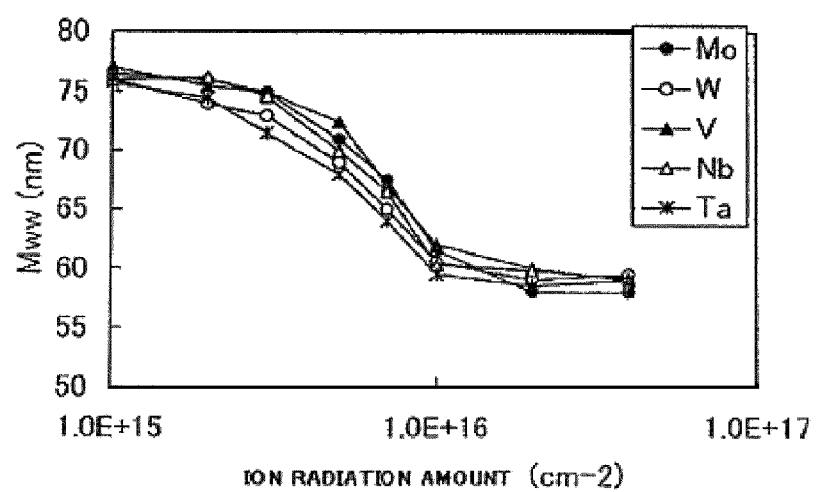
FIG. 12 is a drawing showing the evaluation results of the magnetic write width Mww.
Figure 13:
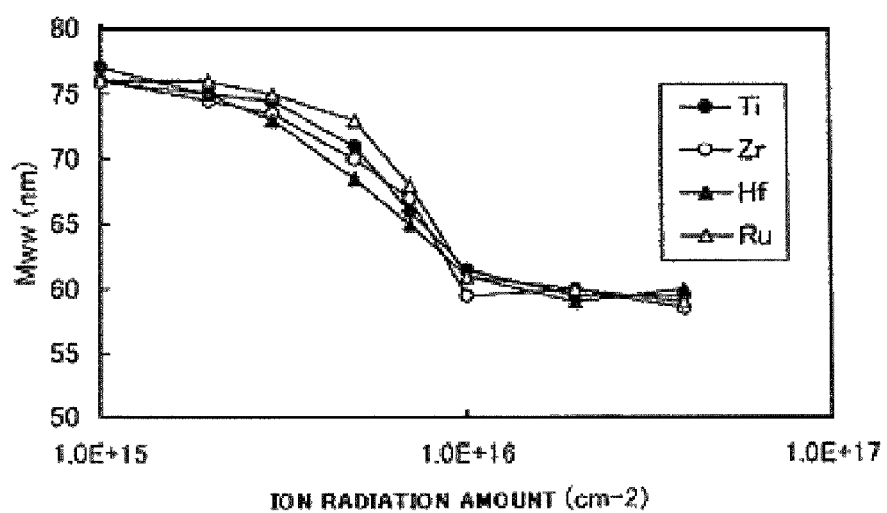
FIG. 13 is a drawing showing the evaluation results of the magnetic write width Mww.
Figure 14:
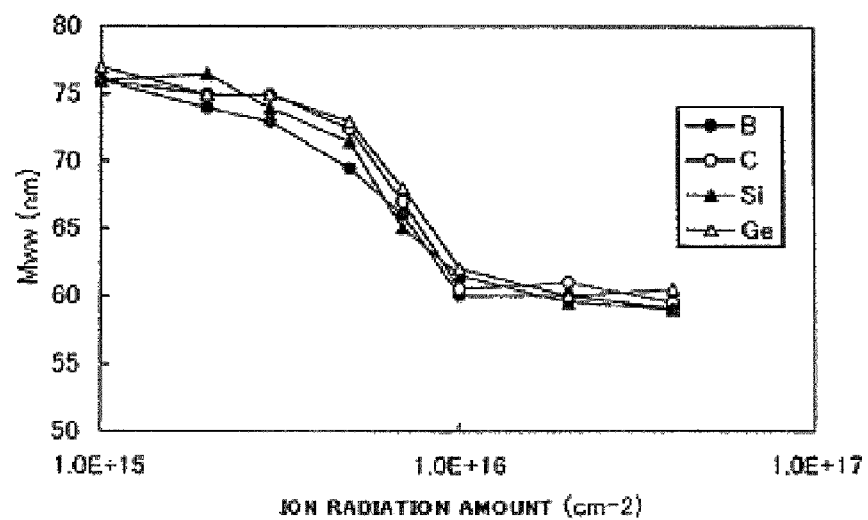
FIG. 14 is a drawing showing the evaluation results of the magnetic write width Mww.

The Mww was evaluated using the same head as the Example 1 in each element. The results are shown in FIGS. 12 to 14. First, at the point where the radiation amount of nonmagnetic element ions 22 is the least, the Mww was about 75 nm in each element, which was almost the same as the Mww in the Example 1 in the same radiation amount. In the area where the radiation amount of nonmagnetic element ions 22 was less than $1 \times 10^{16}/cm^2$, the Mww gradually decreased with increase in the radiation amount in every element, but the value of the Mww has some variation. However, in the area where the radiation amount of nonmagnetic element ions 22 was $1 \times 10^{16}/cm^2$ or more, the Mww was about 60 nm in every element, which was almost the same value as the Mww in the Example 1 in the same radiation amount. That is, it was recognized that the same level track density as the Example 1 may be achieved by radiating the amount of $1 \times 10^{16}/cm^2$ or more in each element.

However, in the media using Mo, W, V, Nb, Ti, Zr, Hf, and Ru, corrosion resistance was slightly inferior to the media using Cr, although there would be no problem. In the media using B, C, Si, and Ge, the surface at the upper part of the track separator 23 became slightly rougher after the ion radiation, which was not such a level to obviously affect the flying performance, though. In the case using Ta ions as the nonmagnetic element ions 22, the media whose corrosion resistance and surface roughness were same level as the media in the Example 1 was obtained.

COMPARATIVE EXAMPLE 1

Discrete track media were prepared in the same manner as the Example 1, except for changing the acceleration voltage in Cr ion radiation in the Example 1 into 25 kV.

Figure 15:
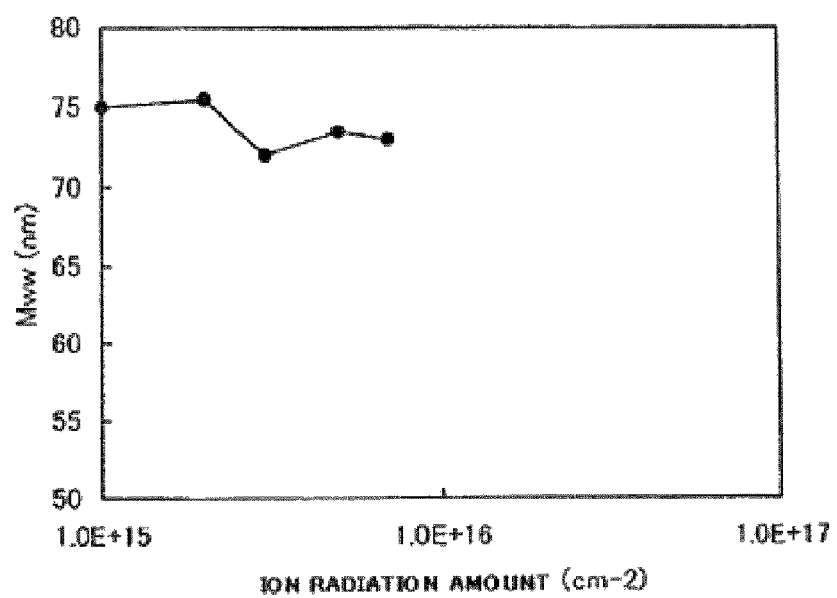
FIG. 15 is a drawing showing the evaluation results of the magnetic write width Mww.

The results of evaluation of Mww in the same manner as the Example 1 are shown in FIG. 15. When the ion radiation amount was $7\times10^{15}/cm^2$ or less, the Mww was able to be evaluated without problem, but when $1\times10^{16}/cm^2$ or more, the Mww could not be evaluated normally.

Figure 16:
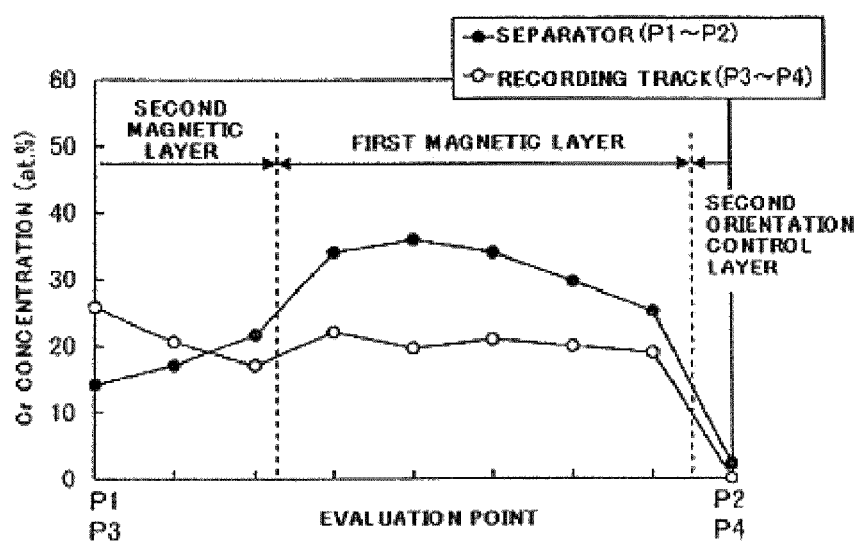
FIG. 16 is a schematic drawing showing the element analysis of the medium.

Then, with respect to a sample with Cr ion radiated in the amount of $1\times10^{16}/cm^2$, on which the Mww could not be evaluated normally, the Cr concentrations at a recording track and a track separator 23 were analyzed in the same manner as the Example 1. In analyzing, an energy dispersive X-ray fluorescence spectrometer (EDX) was used. The results are shown in FIG. 16.

Particularly in the second magnetic layer 19, the part corresponding to the recording track had higher Cr concentration than the part corresponding to the track separator 23, and the upper part of the part corresponding to the recording track contained 25 at. % or more of Cr. Namely, it was revealed that magnetization in the recording tracks was significantly reduced because of inclusion of a large amount of Cr, and as a result, the Mww could not be evaluated normally.

The cause of the significant increase in Cr concentration in the recording track is as follows. When the acceleration voltage was low as 10 kV as in the Example 1, even if the film thickness of the resist pattern 20' was 90 nm, it was possible for Cr ions not to reach the second magnetic layer 19 of the recording tracks or for Cr ions not to be implanted into the recording tracks. On the contrary, when the acceleration voltage was raised to 25 kV as in the present comparative example, 90 nm was not enough for the thickness of the resist pattern 20' to eliminate the Cr ions to reach the second magnetic layer of the recording tracks or to be implanted into the recording tracks. As a result, Cr ions were implanted into the recording tracks and the Cr concentration in the recording tracks was increased.

Besides, when the acceleration voltage was raised to 25 kV, the center of the Cr containing range in the track separator went deeper, too. In the media of the Example 1 at the acceleration voltage as low as 10 kV, the Cr concentration was highest in the second magnetic layer 19. On the contrary, in the present comparative example, as shown in the analysis in FIG. 16, the Cr concentration in the first magnetic layer 18 was about 30 at. %, the one in the second magnetic layer 19 was from about 15 at. % to 20 at. %; the Cr concentration was higher in the first magnetic layer. Further, when the Cr concentration of the second magnetic layer 19 was as low as 15 at. % to 20 at. %, the magnetization was not reduced sufficiently so that it was recognized that the recording tracks of the second magnetic layer 19 were not sufficiently separated.

COMPARATIVE EXAMPLE 2

Discrete track media were prepared and evaluated in the same manner as the Example 1, except for changing the compositions of the first magnetic layer 18 and the second magnetic layer 19 in the Example 1. Two kinds of media were prepared; one (referred to as Comparative Example 2-1) includes a 65 mol % Co-11 mol % Cr-16 mol % Pt-8 mol % $SiO_2$ alloy as the first magnetic layer 18 and a 62 at. % Co-13 at. % Cr-18 at. % Pt-7 at. % B alloy as the second magnetic layer 19, and the other (referred to as Comparative Example 2-2) includes a 57 mol % Co-20 mol % Cr-17 mol % Pt-6 mol % $SiO_2$ alloy as the first magnetic layer 18 and a 54 at. % Co-18 at. % Cr-18 at. % Pt-10 at. % B alloy as the second magnetic layer 19. The film thickness of each first magnetic layer 18 was 13 nm, and the film thickness of each second magnetic layer 19 was 6 nm.

Figure 17:
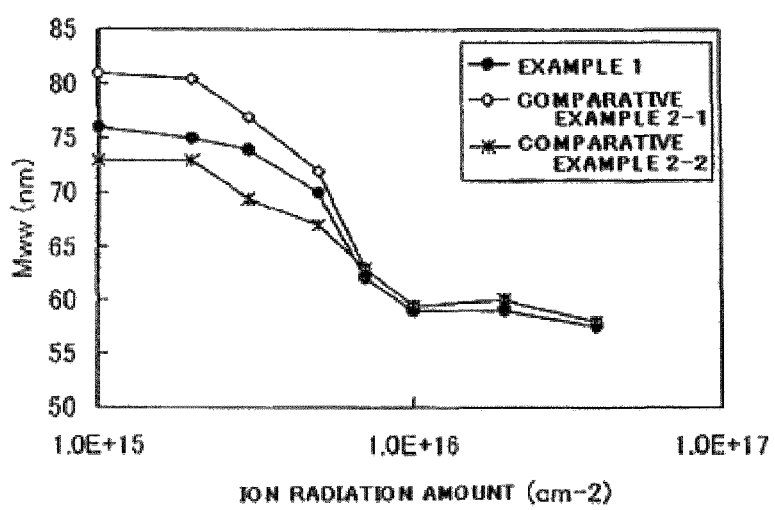
FIG. 17 is a drawing showing the evaluation results of the magnetic write width Mww.

The evaluation results of Mww in the same manner as the Example 1 are shown in FIG. 17. In the areas with the smaller ion radiation amount of $5\times10^{15}/cm^2$ or less, differences in Mww were observed between the Example 1 and the present comparative examples, but in the areas with that of $7\times10^{15}/cm^2$ or more, the Mww's in the present comparative examples were approximately the same as the Example 1.

Then, with respect to the media with the dose of $2\times10^{16}/cm^2$ among the media with the Mww reduced to about 60 nm, the signal to noise ratio, S/N, in the media of Example 1 and the present comparative examples were evaluated. Using the same evaluation head as the one used in the evaluation of Mww in the Example 1, the S/N was calculated from the medium noise at the highest recording density HF=64 kFC/mm and the signal output at the median recording density MF=HF/2=32 kFC/mm.

Compared with that the S/N in the media of the Example 1 was 17.7 dB, the S/N in the media of the Comparative Example 2-1 was 14.3 dB, and the S/N in the media of the Comparative Example 2-2 was 15.5 dB. It was recognized that the read/write performance was significantly deteriorated in the media in both of the present comparative examples, compared with the media in the Example 1.

The cause of the significant deterioration in the S/N of the media of the Comparative Example 2-1 may be explained as follows. Compared with that the Co Concentration of the first magnetic layer 18 was 57 mol % in the media of the Example 1, the Co concentration of the present comparative example was as high as 65 mol % and the magnetization was large. Therefore, in the media of the Comparative Example 2-1, even if the Cr ion radiation reduced the magnetization of the second magnetic layer 19 sufficiently, the magnetic flux by the first magnetic layer 18 strayed to the surface of the track separator 23 because of the large magnetization of the first magnetic layer 18. The magnetic flux on the surface of the track separator 23 became a noise source to significantly deteriorate the S/N. In the media of the Example 1, the Co concentration in the first magnetic layer 18 was low and the magnetization was small, so that the magnetic stray flux on the surface of the track separator 23 was too small to cause the deterioration in the S/N.

The cause of the significant deterioration in the S/N of the media of the Comparative Example 2-2 may be explained as follows. If the Co concentration in the first magnetic layer was lowered to reduce the magnetization as in the Example 1, it was necessary to increase the magnetization of the second magnetic layer to obtain sufficient signal output. The Co concentration of the second magnetic layer 19 in the Example 1 was 62 mol % and was higher than the Co concentration of the first magnetic layer 18, 57 mol %, and its magnetization was larger, but the Co concentration of the second magnetic layer in the Comparative Example 2-2 was 54 mol % and was lower than the Co concentration of the first magnetic layer 18, 57 mol %, and its magnetization was smaller. Accordingly, in the Comparative Example 2-2, the magnetization of the entire recording tracks became smaller and the signal output was reduced so that the S/N was deteriorated.

As seen from the above, to suppress the medium noise and obtain sufficient signal output, it is necessary that the concentration of the ferromagnetic element (Co in the present embodiment) included in the second magnetic layer 19 is higher than the concentration of the ferromagnetic element included in the first magnetic layer 18.

What is claimed is:

1. A magnetic recording medium comprising:
   a magnetic recording layer formed on a substrate and having at least two ferromagnetic alloy layers having different compositions;
   portions of the ferromagnetic alloy layers contain a nonmagnetic element arranged in an in-plane direction across the magnetic recording layer to define tracks without the nonmagnetic element and track separators with the nonmagnetic element, and the tracks and the track separators are co-planar with each other; and
   the nonmagnetic element extends completely through one of the ferromagnetic alloy layers, but only partially through the other ferromagnetic alloy layer.

2. A magnetic recording medium according to claim 1, wherein the ferromagnetic alloy layer located closest to a surface of the magnetic recording medium has a higher concentration of the nonmagnetic element than other layers.

3. A magnetic recording medium according to claim 1, wherein the portions of the ferromagnetic alloy layers are formed substantially concentrically.

4. A magnetic recording medium according to claim 1, wherein the nonmagnetic element is selected from the group consisting of Cr, Mo, W, V, Nb, Ta, Ti, Zr, Hf, Ru, B, C, Si, and Ge.

5. A magnetic recording medium according to claim 1, wherein the magnetic recording layer includes Co.

6. A magnetic recording medium according to claim 1, wherein the magnetic recording layer includes Co, and the nonmagnetic element is Cr or Ta.

7. A magnetic recording medium according to claim 1, wherein the nonmagnetic element is formed by implanting ions of the nonmagnetic element.

8. A magnetic recording medium comprising:
   a substrate;
   an adhesion layer;
   a first soft-magnetic layer;
   an antiferromagnetic coupling layer;
   a second soft magnetic layer;
   an under layer;
   a first orientation control layer;
   a second orientation control layer;
   a magnetic recording layer having at least two ferromagnetic alloy layers with different compositions;
   portions of the ferromagnetic alloy layers contain a nonmagnetic element arranged in an in-plane direction across the magnetic recording layer to define tracks without the nonmagnetic element and track separators with the nonmagnetic element, and the tracks and the track separators are co-planar with each other; and
   the nonmagnetic element extends completely through one of the ferromagnetic alloy layers, but only partially through the other ferromagnetic alloy layer.

9. A magnetic recording medium according to claim 8, wherein the layers are stacked on each other in the order in which they are listed.

10. A magnetic recording medium according to claim 8, wherein the ferromagnetic alloy layer located closest to a surface of the magnetic recording medium has a higher concentration of the nonmagnetic element than other layers except for the intermediate layer.

11. A magnetic recording medium according to claim 8, wherein the portions of the ferromagnetic alloy layers are formed substantially concentrically.

12. A magnetic recording medium according to claim 8, wherein the nonmagnetic element is selected from the group consisting of Cr, Mo, W, V, Nb, Ta, Ti, Zr, Hf, Ru, B, C, Si, and Ge.

13. A magnetic recording medium according to claim 8, wherein the magnetic recording layer includes Co.

14. A magnetic recording medium according to claim 8, wherein the magnetic recording layer includes Co, and the nonmagnetic element is Cr or Ta.

15. A magnetic recording medium according to claim 8, wherein the nonmagnetic element is formed by implanting ions of the nonmagnetic element.

* * * * *